United States Patent
Kadowaki et al.

(10) Patent No.: US 9,139,899 B2
(45) Date of Patent: Sep. 22, 2015

(54) TARGET DEVICE, SPUTTERING APPARATUS AND METHOD FOR MANUFACTURING A TARGET DEVICE

(71) Applicant: ULVAC, Inc., Chigasaki-shi, Kanagawa (JP)

(72) Inventors: Yutaka Kadowaki, Chiba (JP); Kazutoshi Takahashi, Chiba (JP); Masaru Sato, Chiba (JP); Chengfu Lin, Chiba (JP)

(73) Assignee: ULVAC, INC., Chigasaki-shi (JP)

( * ) Notice: Subject to any disclaimer, the term of this patent is extended or adjusted under 35 U.S.C. 154(b) by 164 days.

(21) Appl. No.: 13/710,775

(22) Filed: Dec. 11, 2012

(65) Prior Publication Data

US 2013/0186752 A1    Jul. 25, 2013

(30) Foreign Application Priority Data

Dec. 13, 2011 (JP) ................. 2011-272742

(51) Int. Cl.
*C23C 14/34* (2006.01)
*C23C 14/06* (2006.01)
*C23C 14/32* (2006.01)
*B23K 1/00* (2006.01)

(52) U.S. Cl.
CPC ......... *C23C 14/3407* (2013.01); *C23C 14/0641* (2013.01); *C23C 14/32* (2013.01); *B23K 1/0008* (2013.01)

(58) Field of Classification Search
USPC ............. 228/116, 159, 164, 203; 204/298.12, 204/298.13
See application file for complete search history.

(56) References Cited

U.S. PATENT DOCUMENTS

| | | | | |
|---|---|---|---|---|
| 5,282,943 A * | 2/1994 | Lannutti et al. | .......... | 204/192.12 |
| 5,879,524 A * | 3/1999 | Hurwitt et al. | .......... | 204/298.12 |
| 6,376,281 B1 * | 4/2002 | Kohler et al. | ................. | 438/118 |
| 6,849,139 B2 * | 2/2005 | Kardokus et al. | ............ | 148/522 |
| 7,467,741 B2 * | 12/2008 | Wickersham et al. | ......... | 228/114 |
| 2001/0048020 A1 * | 12/2001 | Kuriyama et al. | ............ | 228/221 |
| 2005/0067469 A1 * | 3/2005 | Facey et al. | .................... | 228/245 |
| 2008/0000770 A1 * | 1/2008 | White | ...................... | 204/298.12 |
| 2008/0006528 A1 * | 1/2008 | Gilman et al. | ........... | 204/298.12 |
| 2011/0114999 A1 * | 5/2011 | Yamazaki et al. | ............. | 257/280 |

FOREIGN PATENT DOCUMENTS

JP    2002-146523 A1    5/2002

OTHER PUBLICATIONS

Satou et al., "Coating Films of Titanium Nitride by Ion and Vapor Deposition", Japanese Journal of Applied Physics, vol. 24, No. 6, Jun. 1985, p. 656-660.*

* cited by examiner

*Primary Examiner* — Devang R Patel
(74) *Attorney, Agent, or Firm* — Kratz, Quintos & Hanson, LLP

(57) ABSTRACT

To provide a target device that can easily be reused in which the amount of gas discharge is small. The present invention is a target device including a backing plate and a target plate that is fixed to the backing plate with a metal brazing material, in which a protective film made of a TiN thin film in which a proportion of (111) plane is at a maximum is formed on an exposed portion of the backing plate. The discharge amount of gas is small, and the brazing material that adheres when fixing the target plate can be easily peeled off.

1 Claim, 6 Drawing Sheets

TARGET DEVICE, SPUTTERING APPARATUS AND METHOD FOR MANUFACTURING A TARGET DEVICE

BACKGROUND

The present invention is generally related to a target device provided with a protective film and a sputtering apparatus including the target device, and more particularly to a target device provided with a protective film that protects a backing plate and a sputtering apparatus including the target device.

Currently, thin films (such as, electrodes in a semiconductor apparatus or flat display apparatus) are made using a sputtering apparatus. In a sputtering apparatus, a target device having a target plate formed from constituent materials of a thin film is disposed inside a vacuum chamber and plasma is formed inside the vacuum chamber. The ions inside the plasma are accelerated and impact the target plate so that the target plate is sputtered, and thereby a thin film is formed on a surface of a substrate.

A negative voltage is generally applied to the target plate; and thus, the target plate is attached to a metal backing plate that serves as a cathode electrode. The backing plate is disposed inside a vacuum ambience together with the target plate.

Backing plates are often constituted by aluminum, copper, or copper alloy; and a material that does not discharge much gas in a vacuum ambience is preferred. Furthermore, another desired property is that no color change or surface roughness occurs when a used target plate is exchanged for an unused target plate and then the backing plate is reused.

To accommodate such requirements, for example, a technology for forming a thin film that protects the backing plate on a surface of the backing plate surface has been proposed (see JPA No. 2002-146523).

SUMMARY OF THE INVENTION

Although a conventional protective thin film exhibiting higher surface smoothness than a sprayed thin film has been obtained, such a thin film cannot sufficiently protect the backing plate and a large amount of gas is discharged.

Furthermore, when attaching the target plate to the backing plate with a brazing material, there has been a problem in that protruding brazing material adheres to the backing plate and is troublesome to remove.

The present invention was created to overcome the disadvantages of the above-described conventional art; and an object of the present invention is to provide a protective film for a target device that discharges small amount of gas and has good protective characteristics.

In order to solve the above-mentioned problems, the present invention provides a target device including a backing plate, and a target plate fixed to the backing plate with a metal brazing material, wherein a protective film made of either a TiAlN thin film or a TiN thin film in which a proportion of (111) plane among the orientation planes is at a maximum at an exposed surface is formed on an exposed portion of the backing plate.

The present invention is the target device in which the backing plate is made of pure copper or a copper alloy.

The present invention is a sputtering apparatus including the above discussed target device.

The present invention is the sputtering apparatus in which the target device is disposed in a vacuum chamber.

The present invention is a method for manufacturing a target device, which includes the steps of disposing a backing plate in a nitrogen gas environment under a pressure lower than 1 atm; ionizing and vaporizing a titanium metal, and bringing the ions to reach the backing plate while applying a voltage that is negative and whose absolute value is 100 V or more to the backing plate; forming a protective film made of titanium nitride on a surface of the backing plate; and then, attaching a target plate to the backing plate.

The protective film of the present invention is made of a TiN thin film in which a plane of (111) plane orientation is exposed on the surface, and the adhesion of an indium brazing material is low.

Furthermore, discharge amount of gas of the protective film is small, so that it can be used in a high vacuum ambience.

DETAILED DESCRIPTION OF THE INVENTION

Figure 2:
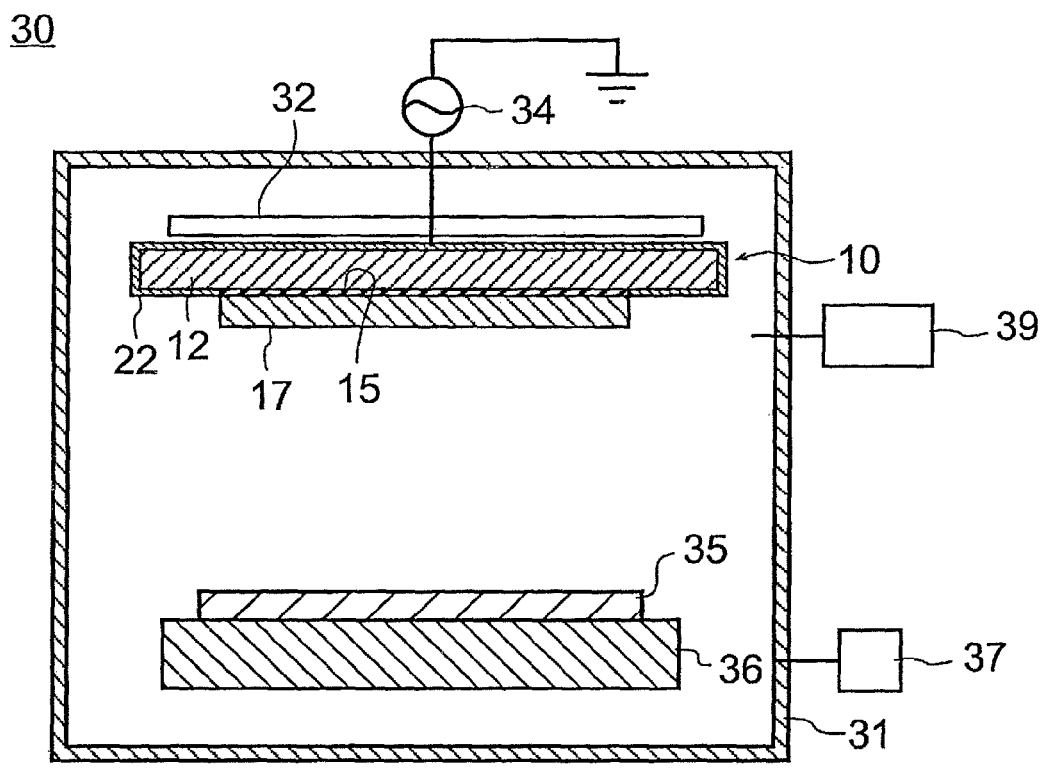
FIG. 2 illustrates an example of a sputtering apparatus using the target device of the present invention.

FIG. 2 shows a sputtering apparatus 30 having a vacuum chamber 31. A target device 10 of the present invention is disposed inside the vacuum chamber 31.

Figure 1:
FIGS. 1(a) to 1(f) is a process chart for illustrating the manufacturing of a target device of the present invention.
Figure 1:
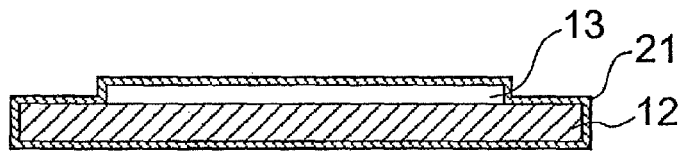
Figure 1:
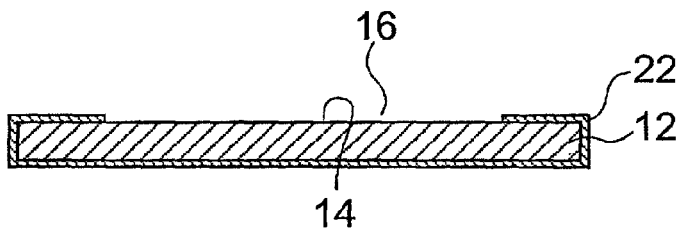
Figure 1:
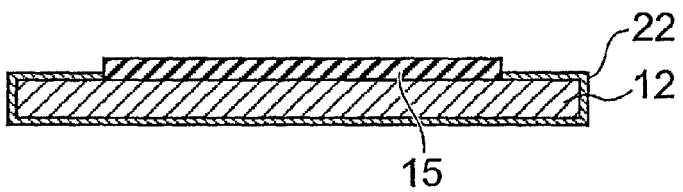
Figure 1:
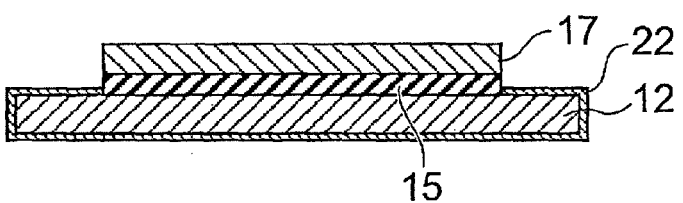
Figure 1:
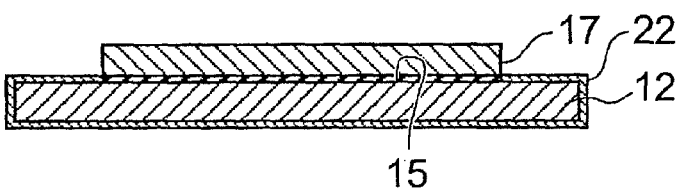

As shown in FIG. 1(f), the target device 10 has a metallic backing plate 12. A target plate 17 is attached onto the backing plate 12 by a metal brazing material 15. In this example, the backing plate 12 is made of pure copper or a copper alloy, and the metal brazing material 15 is made of indium including additives.

A substrate holder 36 is provided at a position facing the target plate 17 in the vacuum chamber 31. A substrate 35 is disposed on the substrate holder 36.

The inside of the vacuum chamber 31 is evacuated in advance by a vacuum pump system 37. A sputtering gas is then introduced into the vacuum chamber 31 from a gas introduction system 39. When a voltage is applied to the target device 10 by a sputtering power source 34, the surface of the target plate 17 is sputtered and a thin film is formed on the substrate 35 disposed on the substrate holder 36.

In general, a magnetron magnet 32 is disposed on a rear surface of the target device 10. The sputtering speed of the target plate 17 is improved by the magnetic field generated by the magnetron magnet 32.

In this target device 10, a protective film 22 is formed on exposed portions where the target plate 17 is not attached among the entire surface of the backing plate 12 including the rear surface and side surfaces. Therefore, in the target device 10, the surface of the target plate 17 and the surface of the protective film is exposed.

A process for manufacturing the target device 10 will now be explained. First, an adhesion-preventing panel 13 is disposed on a portion where the target plate 17 is to be subsequently provided among the entire surface of the backing plate 12 so as to constitute a film forming target object 11 for forming the protective film. In the film forming target object 11, the location where the target plate 17 is to be disposed is covered with the adhesion-preventing panel 13, and the adhesion-preventing panel 13 is temporarily fixed to the surface of the backing plate 12.

Figure 3:
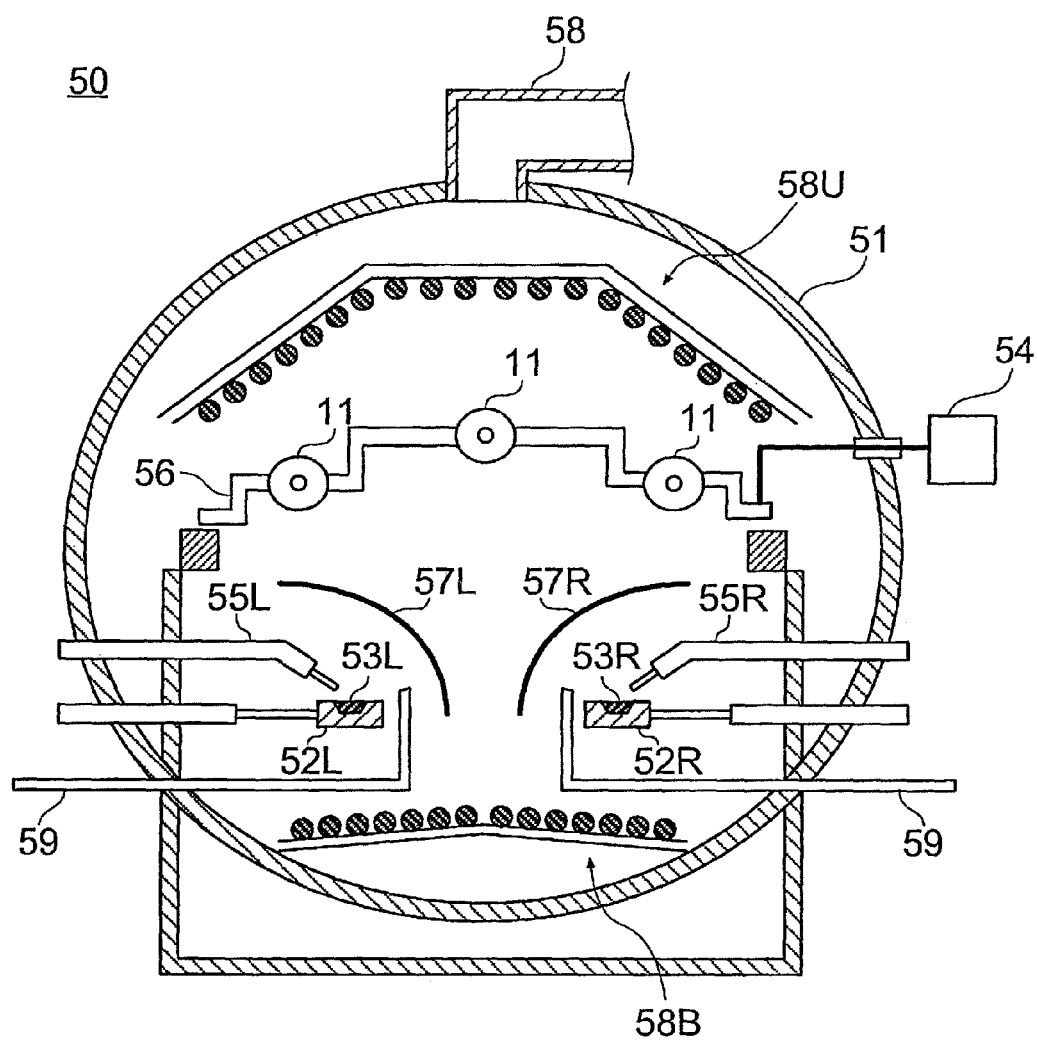
FIG. 3 illustrates an example of an ion plating apparatus for manufacturing the target device of the present invention.

At least one of a plurality of the film forming target objects 11 is transported into a vacuum chamber 51 of a film forming apparatus shown in FIG. 3, which has been evacuated to be a vacuum ambience by the vacuum pump system 58; and then, the film forming target object 11 is held on a plate holder 56.

Inside the vacuum chamber 51, at lest one of a plurality of crucibles 52L and 52R is disposed at a position below the plate holder 56. Raw materials of the protective film 53L and 53R are disposed respectively in the crucibles 52L and 52R, respectively.

The raw materials 53L and 53R are metals. Argon gas plasma is generated inside hollow cathodes 55L, 55R disposed adjacent to the crucibles 52L and 52R; and when argon ions or thermo electrons are extracted and irradiated onto the raw materials inside the crucibles 52L and 52R, respectively, metal ions are emitted from the raw materials 53L and 53R inside the crucibles 52L and 52R.

After the emission of the metal ions has stabilized, when shutters 57L, 57R are opened, the metal ions of the raw materials proceed toward the film forming target objects 11.

At this time, a reactive gas is introduced in advance into the vacuum chamber 51 from a gas introduction pipe 59 so as to create a vacuum ambience including the reactive gas inside the vacuum chamber 51.

A bias power source 54 is connected to the plate holder 56 and the vacuum chamber 51 is connected to a ground potential. A negative bias voltage Vb is applied to each of the film forming target objects 11 via the plate holder 56; and the metal ions are brought to the film forming target objects 11 disposed on the plate holder 56.

The film forming target objects 11 are heated by heaters 58U and 58B to raise their temperatures; and when the ions reach the film forming target objects 11 inside the nitrogen gas environment, the metal ions of the raw materials and the reactive gas react with each other on the surface of the film forming target objects 11. As shown in FIG. 1(b), a thin film 21 of the reaction products is formed on the exposed surfaces of the backing plate 12 and the adhesion-preventing panel 13.

Here, titanium metal is disposed as the raw materials and nitrogen gas is used as the reactive gas; and thus, a thin film of titanium nitride is formed. In particular, the film forming conditions of the titanium nitride thin film (such as, the bias voltage or the like) are controlled, so that a titanium nitride thin film in which a plane orientation of (111) plane is exposed is formed on the surface of the backing plate 12, as the protective film.

After forming the titanium nitride thin film, the adhesion-preventing panel 13 is removed from the surface of the backing plate 12. Thus, a portion of the thin film 21 of the reaction products where the adhesion-preventing panel 13 was positioned is removed. Due to the removal of this portion of the thin film 21, as shown in FIG. 1(c), an opening 16 is formed at the portion where the adhesion-preventing panel 13 was positioned so as to expose the surface of the backing plate 12, and a protective film 22 that covers the other portions of the surface of the backing plate 12 is formed. In a portion 14 of the backing plate 12 after the adhesion-preventing panel 13 has been removed, the material of the backing plate 12 is exposed.

After the protective film 22 is formed, the surface of the backing plate 12 is washed; and as shown in FIG. 1(d), a brazing material (herein, indium) 15 is disposed in the portion 14, which is the portion of the surface of the exposed backing plate 12.

Next, as shown in FIG. 1(e), the target plate 17 is disposed on the brazing material 15 and compressed under heat to soften and melt the brazing material. The brazing material is then cooled and solidified; and thus, as shown in FIG. 1(f), the target plate 17 is attached to the backing plate 12. Thus, the target device 10 is obtained.

When the target plate 17 is attached to the backing plate 12, the softened and melted brazing material 15 is pushed out from between the target plate 17 and the backing plate 12 and protrudes out to the outside of the target plate 17. However, the protective film 22 is exposed on the outside of the target plate 17, and the protruded brazing material solidifies in such a state that it contacts the protective film 22. Therefore, the protruded brazing material solidifies without contacting the backing plate 12. The softened and melted material of the brazing material 15 cannot adhere to the protective film 22; and thus, once it solidifies, it can be easily peeled away from the protective film 22. Thus, the solidified material on the surface of the protective film 22 is removed by a cleaning step.

Figure 4:
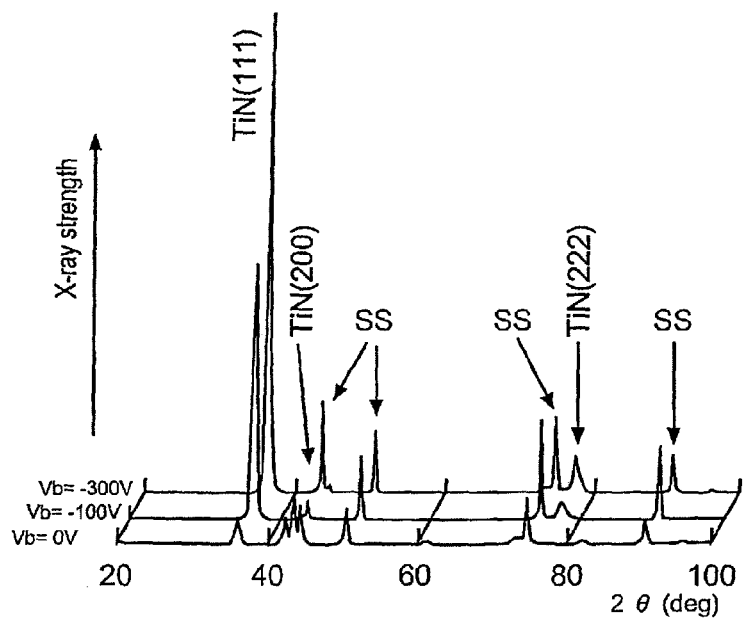
FIG. 4 is an X-ray diffraction analysis chart of a protective film provided in the present invention.

The relationship between the bias voltage Vb and the crystal orientation plane of the surface when the titanium nitride thin film 21 is formed on the target device 10 of the present invention is shown in the X-ray diffraction analysis chart in FIG. 4. The sample used in FIG. 4 and in the measurement of the graph to be explained below is the protective film 22 formed on a stainless steel plate, and the results are the measured values of this protective film 22.

It is known that among the orientation planes of titanium nitride, brazing material can be most easily peeled away from the (111) plane. Therefore, the brazing material is easiest to peel off when the proportion of (111) plane is at a maximum.

If the absolute value of the bias voltage (limited to a negative voltage) becomes 100 V or more, among the plane orientations, the strength exhibiting the (111) plane is higher than the strength exhibiting the (200) plane. The strength exhibiting the (111) plane is higher than the strength of the other plane orientations; and thus, the proportion of the strength of the (111) plane (the proportion of the strength of the (111) plane relative to the total value of the strengths of all of the plane orientations) reaches a maximum.

When the proportion of X-ray strength of the (111) plane is at a maximum, the proportion of the surface area of the (111) plane included in the surface reaches a maximum.

In the chart of FIG. 4, the peak represented by symbol "SS" is the plane orientation peak of the surface of stainless steel.

Figure 5:
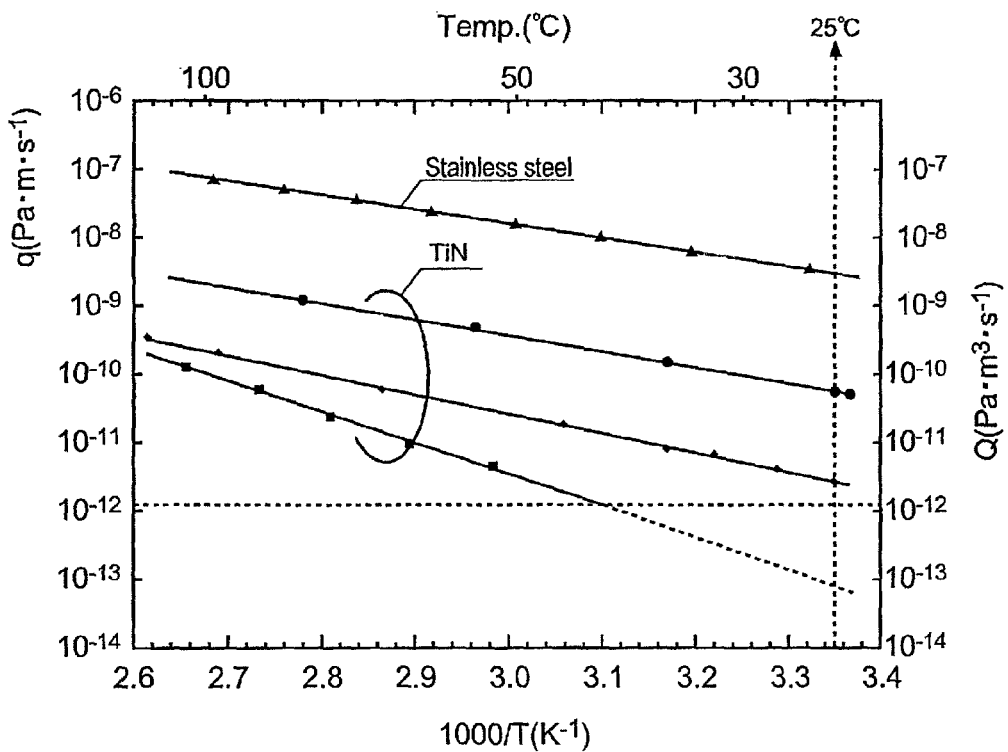
FIG. 5 is a graph comparing the gas discharge amount of the protective film provided in the present invention with the gas discharge amount of stainless steel.
Figure 6:
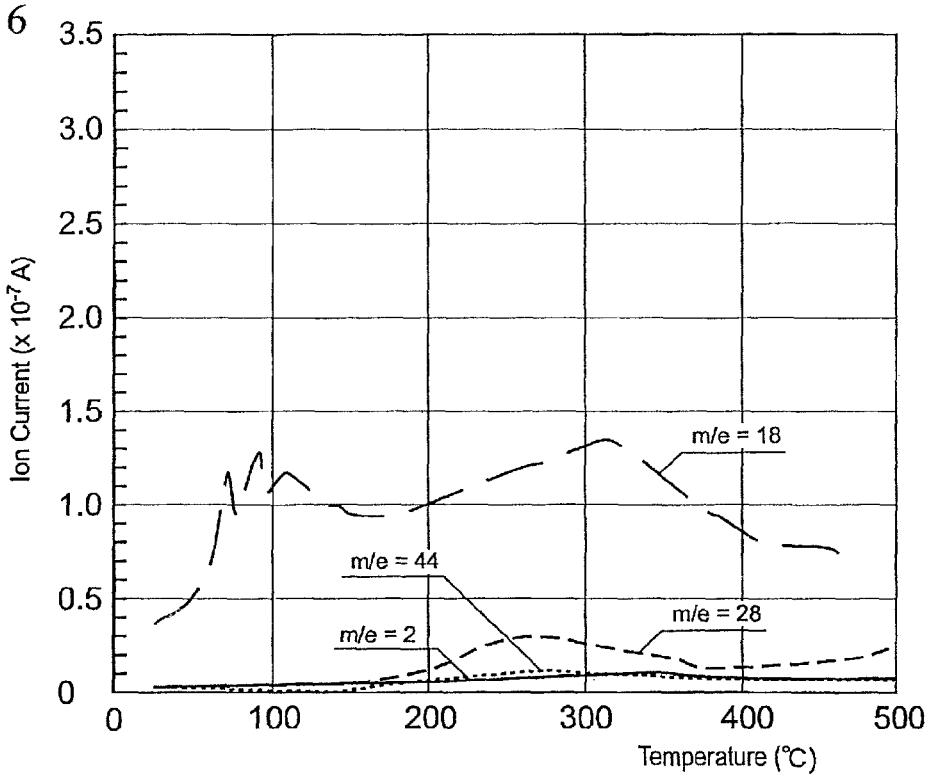
FIG. 6 illustrates the result of an analysis of gas discharged from the protective film provided in the present invention.

Next, the difference in gas discharge amounts between the protective film 22 and stainless Steel is shown in the graph of FIG. 5. The TiN group represents the protective films 22 of the present invention, and the gas discharge amount of each is at least one order of magnitude smaller than the amount of stainless steel. FIG. 6 shows the analysis results of gas discharged from a TiN thin film.

Figure 7:
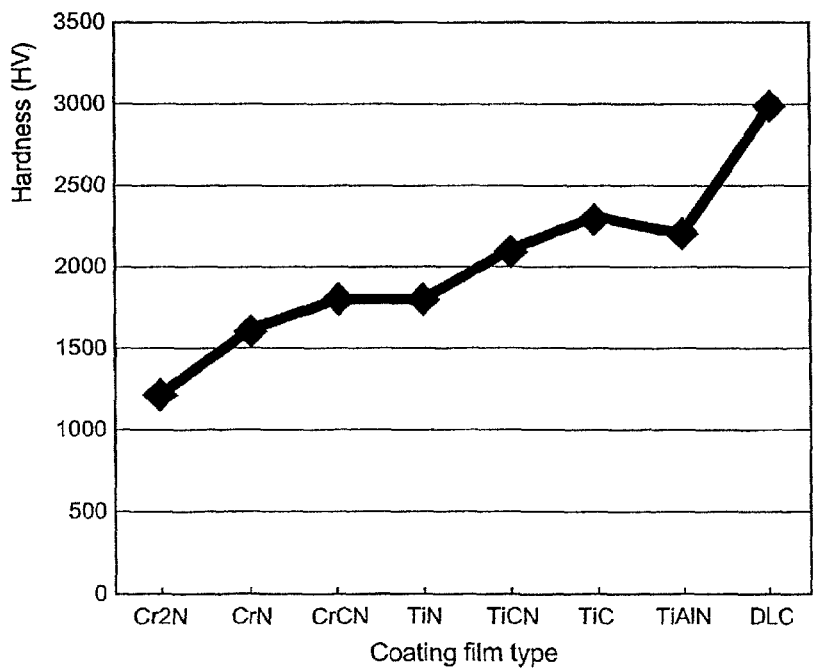
FIG. 7 is a graph comparing the hardness of various thin films.

FIG. 7 is a graph comparing the hardness of the protective film 22 of the present invention to the hardness of thin films of other materials that could conceivably be used as a protective film. TiN thin films and TiAlN thin films are superior because they have high hardness and a low gas discharge amount. Because these thin films can be formed in a portion of a surface of a backing plate where an adhesion-preventing panel is not disposed by an ion plating method, they are suitable as thin films formed on the surface of a backing plate.

Except for the sample used for measurement, in the above examples, the protective film 22 was formed on a copper or copper alloy backing plate. However, the protective film 22 can be formed on a stainless steel backing plate or an aluminum backing plate so as to constitute the target device of the present invention.

In the above embodiments, Ti vapor was generated from the raw materials 53L and 53R in the crucibles 52L and 52R by a hollow cathode plasma source so as to form the TiN thin film. However, the protective film can also be formed by an arc ion plating method (AIP method), in which vapor is discharged from the raw materials by arc discharge and the discharged ions are reacted with the reactive gas to form the thin film.

The TiAlN in FIG. 7 represents measured values of a thin film formed by the AIP method.

The TiN thin film can be formed by either the hollow cathode method or the AIP method.

Figure 8:
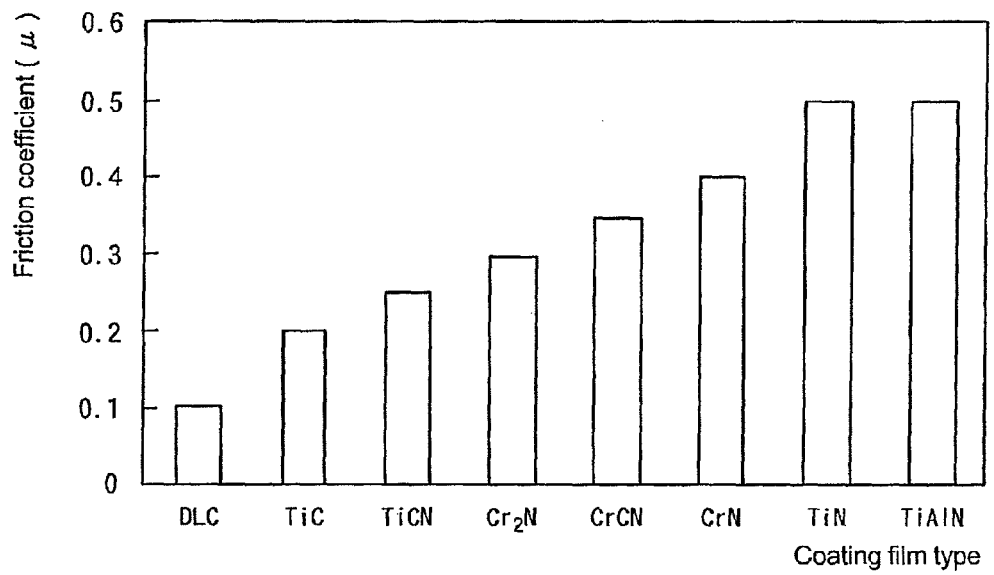
FIG. 8 illustrates the friction coefficient of various coating films.
Figure 9:
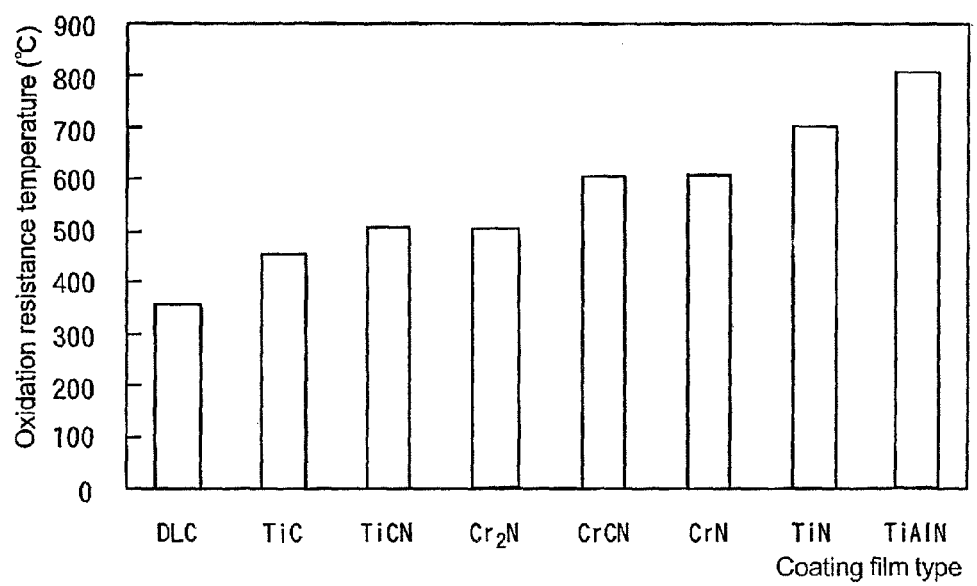
FIG. 9 illustrates the oxidation resistance temperature of various coating films.

FIGS. 8 and 9 show values of the friction coefficient and values of the oxidation resistance temperature (° C.) of various thin films. A coating film having a high oxidation resistance temperature can be used at high temperatures; and thus, such coating films are suitable for protective films of pure copper or copper alloy, and the protective film itself does not change color.

A coating film having a small friction coefficient is suitable for reuse.

The properties of various thin films when the thin film is formed by a surface treatment are shown in Table 1 below.

TABLE 1

Surface treatment and properties

| Property and Process | TiN film | Hard chromium plating | Electroless nickel plating | Alumite | Teflon |
|---|---|---|---|---|---|
| Discharged gas | ◎ | Δ | Δ | Δ | Δ |
| Adherence | ◎ | ○ | ○ | Δ | Δ |
| Dimentional precision | ◎ | Δ | Δ | Δ | Δ |
| Hardness | ◎ | Δ | Δ | ○ | Δ |
| Abrasion resistance | ◎ | Δ | Δ | ○ | Δ |
| Time for delivery | ○ | ○ | ◎ | ◎ | ○ |
| Cost | ○ | ○ | ○ | ◎ | ○ |

Adhered to the surfaces of the TiN film provided in the present invention as well as a CrN film, stainless steel, and hard chromium plating, were molten silica-containing resin, silicon rubber, and solder; and then, the peeling load X (kg/cm$^2$) was measured. The measurement results are shown in Table 2 below.

TABLE 2

Surface layer and release load

| Outermost surface layer | X (kg/cm$^2$) |
|---|---|
| TiN film | 1.2 |
| CrN film | 0.8 |
| SUS440C | 2.8 |
| Hard chromium plating | 3.1 |

In the above examples, the protective film was not formed in a portion where the target plate is to be attached with the brazing material among the entire surface of the backing plate. However, the protective film can also be formed in the portion where the target plate is to be attached and the target plate can be fixed to the protective film.

EXPLANATION OF THE REFERENCE NUMERALS

12 . . . backing plate
14 . . . exposed portion of backing plate
17 . . . target plate
22 . . . protective film
31 . . . vacuum chamber

The invention claimed is:

1. A method for manufacturing a target device, comprising the steps of:
    disposing a backing plate in a nitrogen gas environment under a pressure lower than 1 atm;
    forming a protective film made of titanium nitride on a surface of the backing plate by vaporizing a titanium metal, and bringing the vaporized titanium metal to reach a surface of the backing plate and then,
    fixing a target plate to the backing plate;
    arranging an adhesion-preventing panel onto a part of the backing late where the target plate should be fixed so as to constitute an object to be film-formed by the adhesion-preventing panel and the backing plate,
    forming the protective film on the object to be film-formed by ionizing and vaporizing a titanium metal, and bringing the vaporized titanium metal to reach the backing plate and exposing (111) plane on the surface of the protective film made of titanium nitride:
    removing a part of protective film which is formed on the adhesion-preventing panel from the object to be film-formed by removing the adhesion-preventing panel from the backing plate and the exposing a surface of the backing plate where the adhesion-preventing panel was arranged;
    arranging an indium metal brazing material on the exposed surface of the backing plate;
    fixing the target plate to the backing plate by softening, melting and solidifying the metal brazing material; and then,
    removing the metal brazing material which is in close contact and solidified with the protective film.

* * * * *